United States Patent
Lee et al.

(10) Patent No.: US 9,698,066 B2
(45) Date of Patent: Jul. 4, 2017

(54) SEMICONDUCTOR CHIPS HAVING DEFECT DETECTING CIRCUITS

(71) Applicants: Bo-Ra Lee, Incheon (KR); Jae-Ho Jeong, Suwon-si (KR); Nam-Gyu Baek, Suwon-si (KR); Hyo-Seok Woo, Hwaseong-si (KR); Hyun-Sook Yoon, Anyang-si (KR); Kwang-Yong Lee, Anyang-si (KR)

(72) Inventors: Bo-Ra Lee, Incheon (KR); Jae-Ho Jeong, Suwon-si (KR); Nam-Gyu Baek, Suwon-si (KR); Hyo-Seok Woo, Hwaseong-si (KR); Hyun-Sook Yoon, Anyang-si (KR); Kwang-Yong Lee, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/201,675

(22) Filed: Jul. 5, 2016

(65) Prior Publication Data

US 2017/0103929 A1    Apr. 13, 2017

Related U.S. Application Data

(60) Provisional application No. 62/238,903, filed on Oct. 8, 2015.

(30) Foreign Application Priority Data

Nov. 27, 2015  (KR) .......................... 10-2015-0167248

(51) Int. Cl.
*H01L 21/66*   (2006.01)
*H01L 29/423*  (2006.01)
(Continued)

(52) U.S. Cl.
CPC ............ *H01L 22/32* (2013.01); *H01L 23/562* (2013.01); *H01L 27/1157* (2013.01); *H01L 29/4238* (2013.01)

(58) Field of Classification Search
CPC ........ H01L 22/30; H01L 22/32; H01L 23/562
See application file for complete search history.

(56) References Cited

U.S. PATENT DOCUMENTS 6,649,986 B1    11/2003  Ishizaki et al.
7,649,200 B1     1/2010  Miller et al.
(Continued)

FOREIGN PATENT DOCUMENTS

| JP | 2008-016573 A | 1/2008 |
| JP | 2012-033760 A | 2/2012 |
| JP | 2013074113 A  | 4/2013 |

*Primary Examiner* — Yu-Hsi D Sun
(74) *Attorney, Agent, or Firm* — Harness, Dickey & Pierce, PLC

(57) ABSTRACT

A semiconductor chip includes: a gate pattern on a substrate; an interlayer insulation layer on the gate pattern; a first wiring structure on the interlayer insulation layer; and a defect detection circuit electrically connected to the gate pattern and the first wiring structure. The first wiring structure is electrically connected to the gate pattern via a contact plug through the interlayer insulation layer. The defect detection circuit is electrically connected to the gate pattern and the first wiring structure, and the defect detection circuit is configured to detect defects in the first wiring structure and at least one of the gate pattern and the substrate.

20 Claims, 10 Drawing Sheets

(51) Int. Cl.
*H01L 27/1157* (2017.01)
*H01L 23/00* (2006.01)

(56) References Cited

U.S. PATENT DOCUMENTS

| | | | |
|---|---|---|---|
| 8,159,254 B2* | 4/2012 | Kaltalioglu | G01R 31/2858 |
| | | | 257/48 |
| 8,497,695 B2 | 7/2013 | Matoba et al. | |
| 8,890,560 B2 | 11/2014 | Kaltalioglu | |
| 9,057,760 B2 | 6/2015 | Lacroix et al. | |
| 2008/0165521 A1* | 7/2008 | Bernstein | H01L 21/6835 |
| | | | 361/820 |
| 2009/0321734 A1 | 12/2009 | Ogawa et al. | |
| 2015/0170979 A1 | 6/2015 | Dennison et al. | |

* cited by examiner

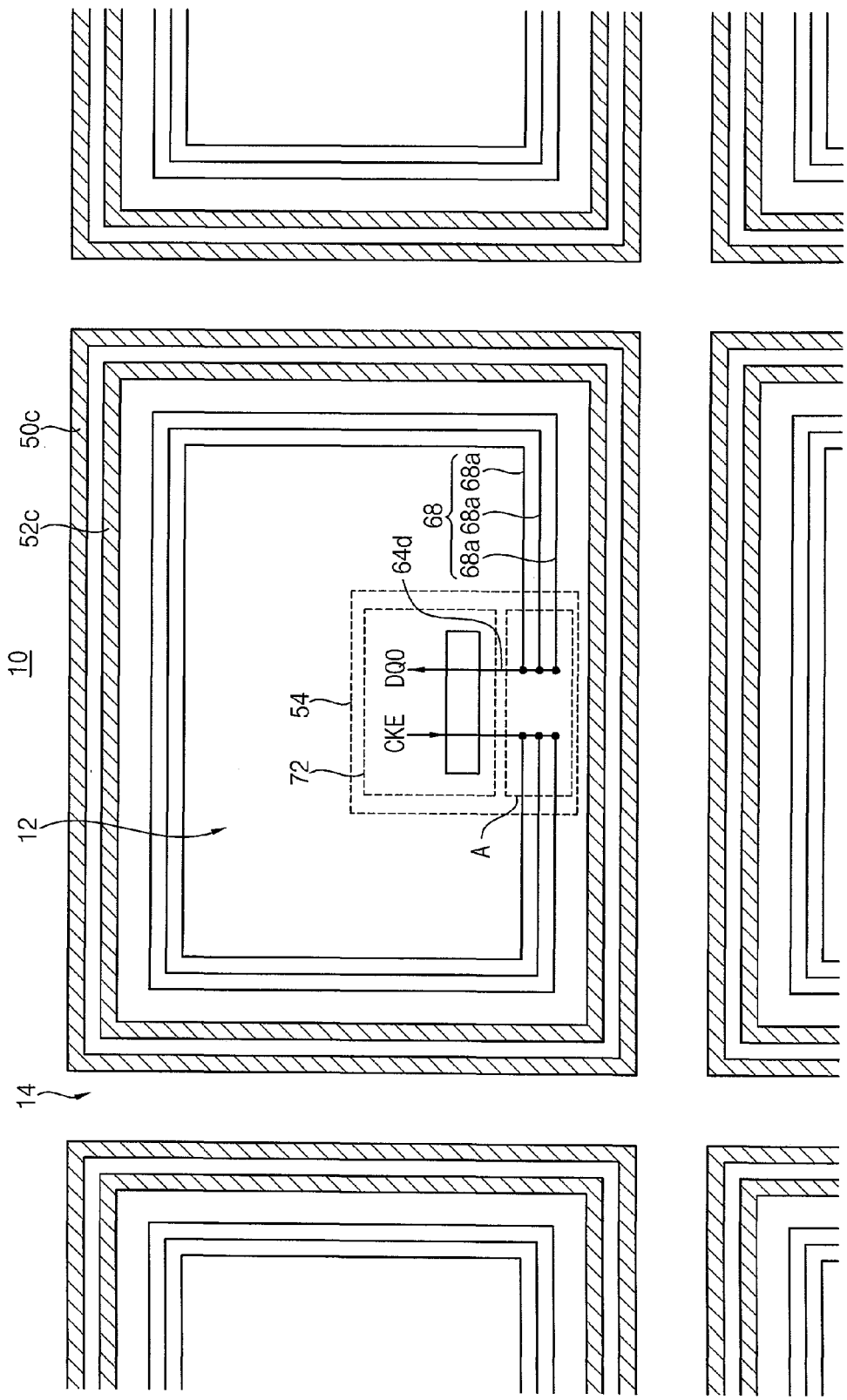

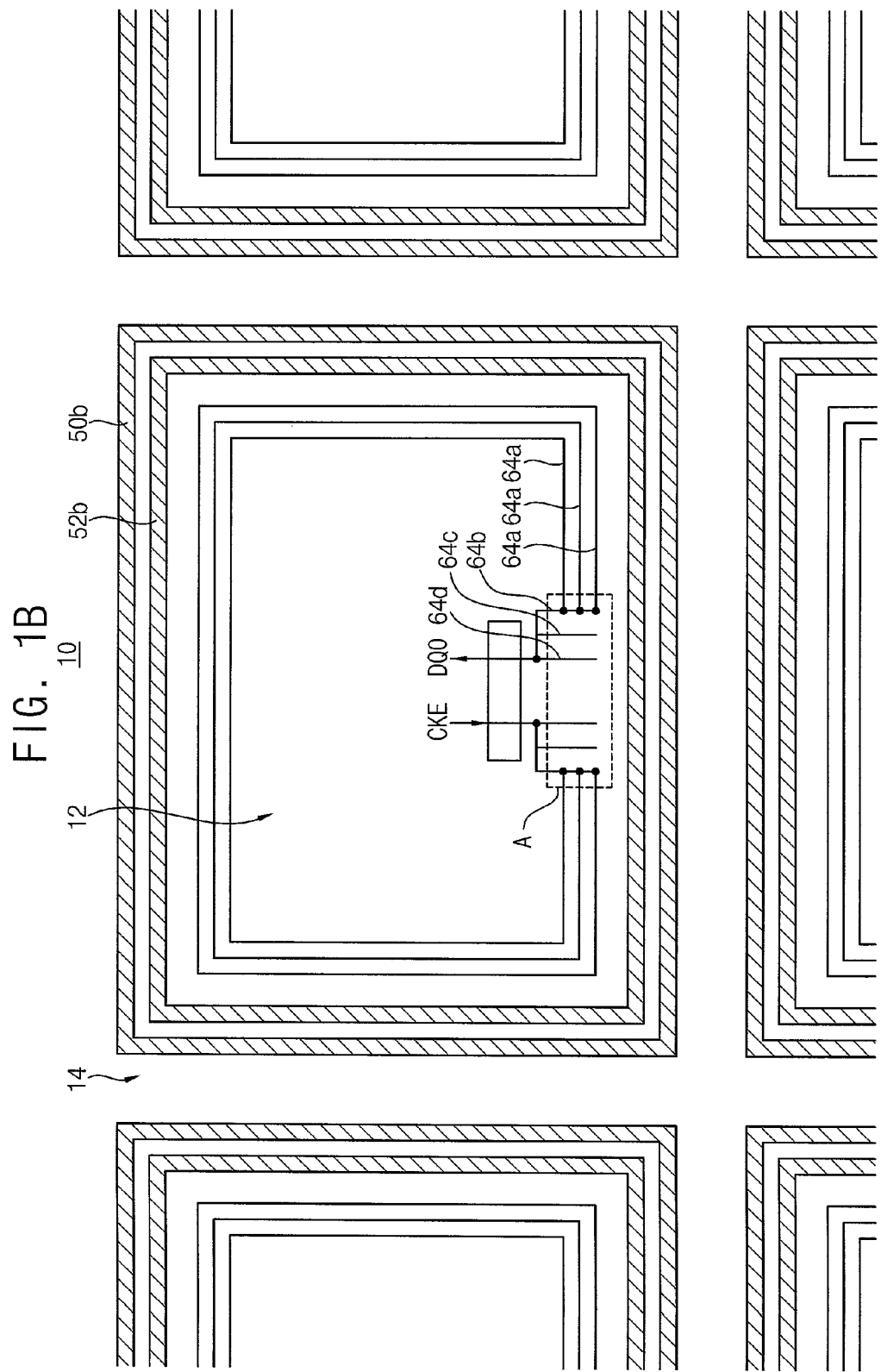

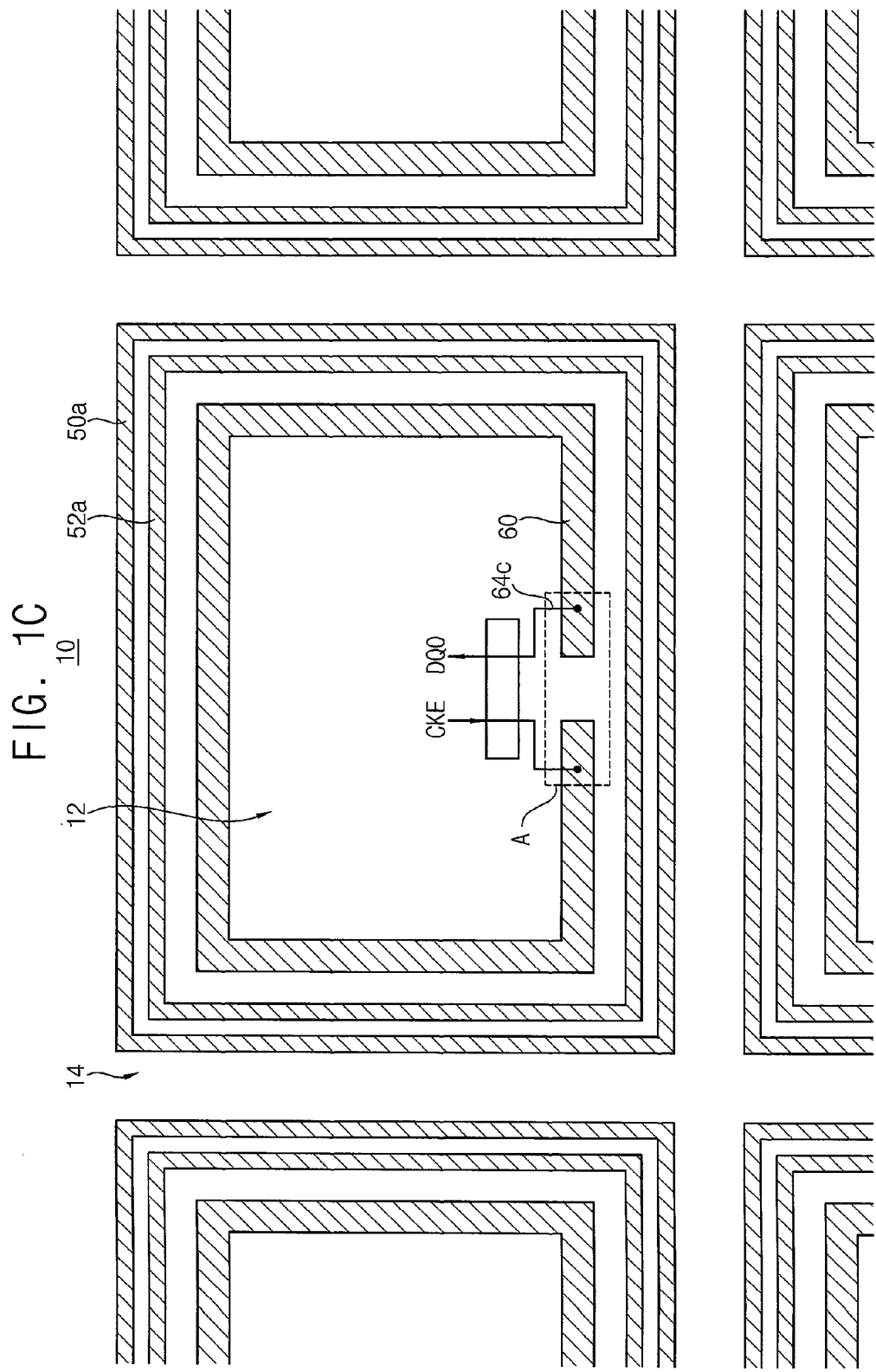

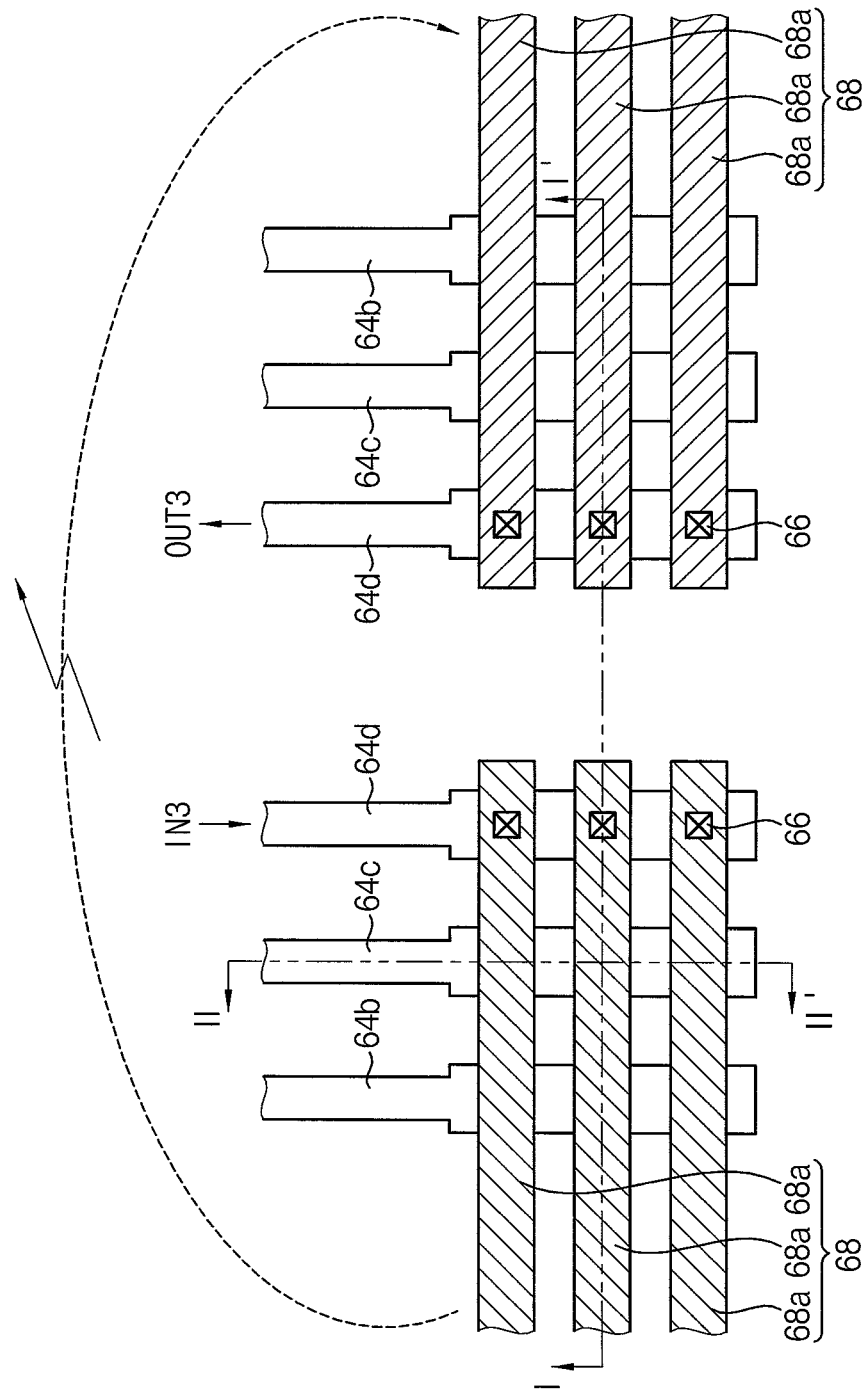

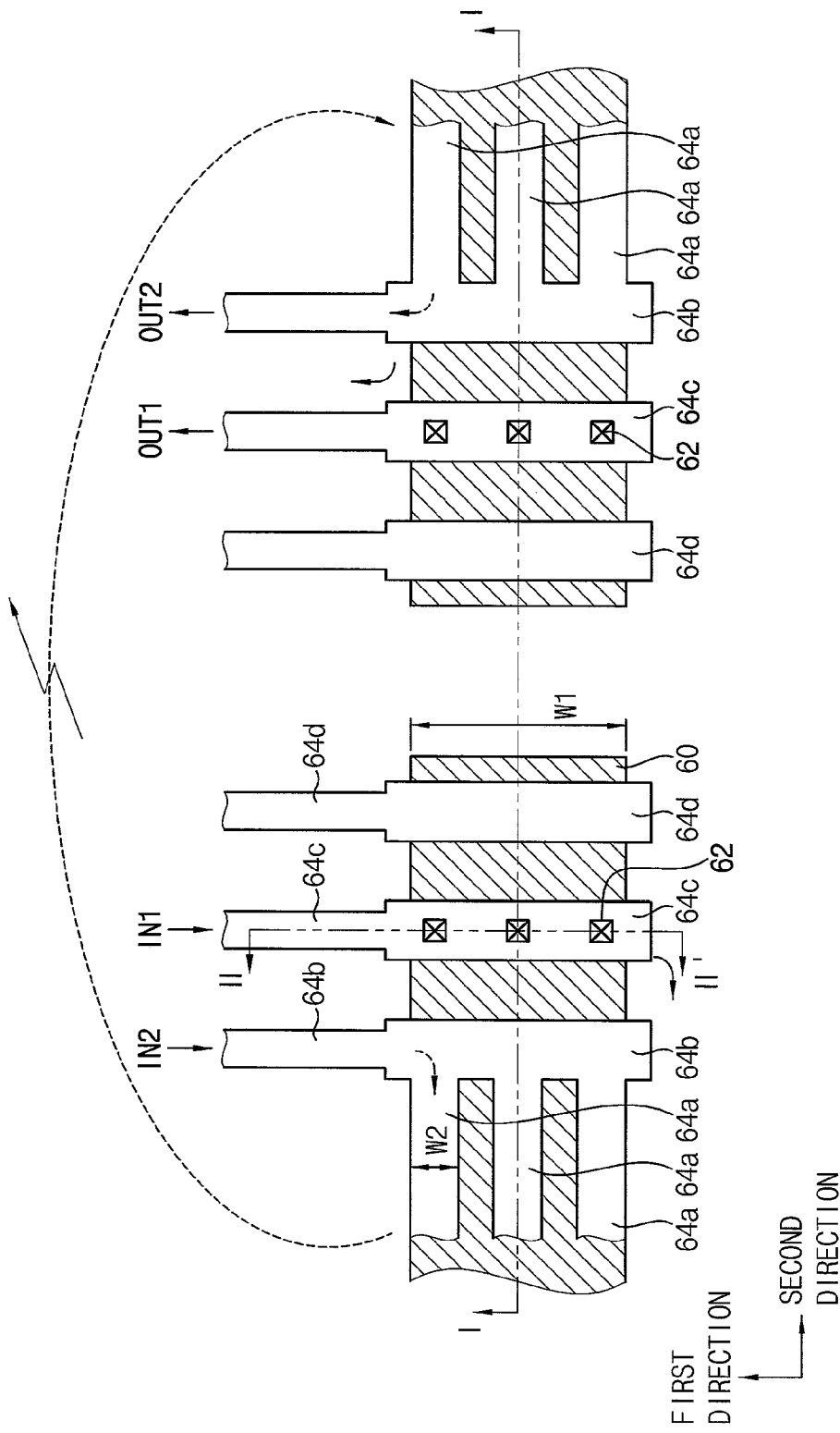

SEMICONDUCTOR CHIPS HAVING DEFECT DETECTING CIRCUITS

CROSS-REFERENCE TO RELATED APPLICATION(S)

This non-provisional application claims priority under 35 U.S.C. §119 to U.S. Provisional Application No. 62/238,903, filed on Oct. 8, 2015, and to Korean Patent Application No. 10-2015-0167248, filed on Nov. 27, 2015 in the Korean Intellectual Property Office (KIPO), the entire contents of each of which are incorporated herein by reference.

BACKGROUND

Field

Example embodiments relate to semiconductor chips. More particularly, example embodiments relate to semiconductor chips including defect detecting circuits.

Description of the Related Art

An electrical operation failure and/or a poor reliability of a semiconductor chip may be generated by defects, such as cracks or chips in the semiconductor chip. Thus, an accurate detection of the defects in semiconductor chips may be needed.

SUMMARY

Example embodiments provide semiconductor chips including defect detection circuits for electrically inspecting defects.

According to example embodiments, there is provided a semiconductor chip. The semiconductor chip includes a gate pattern, a first wiring structure, first contact plug, a first defect detection circuit and a second defect detection circuit. The gate pattern is formed on the substrate. The gate pattern is adjacent to an upper surface of the substrate, and formed along an edge portion of a semiconductor chip region of the substrate. The first wiring structure is formed over the gate pattern. The first wiring structure is spaced apart from the gate pattern, and includes a first conductive pattern formed along the edge portion of the semiconductor chip region. The first contact plug is electrically connected to the gate pattern and to a portion of the first wiring structure. The first defect detection circuit is electrically connected to the gate pattern. The second defect detection circuit is electrically connected to the first wiring structure.

In example embodiments, the gate pattern may have a rectangular ring shape of which a portion adjacent to the first and second defect detection circuit parts is cut away, in a plan view.

In example embodiments, the gate pattern may have a rectangular ring shape, and ends of the gate pattern are adjacent to the first and second defect detection circuits and may be spaced apart from one another, in a plan view.

The first wiring structure may further include a first extension line and a second extension line; the first conductive pattern may have a rectangular ring shape, wherein ends of the first conductive pattern are adjacent to the first and second defect detection circuits, and are spaced apart from one another, in a plan view; the first extension line may contact a sidewall of the first conductive pattern and extends toward the semiconductor chip region; and the second extension line may be spaced apart from the first extension line and contact the first contact plug.

The first extension line may be connected to the second defect detection circuit; and the second extension line may be connected to the first defect detection circuit.

The first defect detection circuit may include: a clock signal circuit electrically connected to a first end portion of the gate pattern, the clock signal circuit configured to operate according to a gate clock signal; a buffer circuit electrically connected to a second end portion of the gate pattern; and an output circuit connected to the buffer circuit.

The second defect detection circuit may include: a dock signal circuit electrically connected to a first end portion of the first conductive pattern, the clock signal circuit configured to operate according to a first conductive pattern clock signal; a buffer circuit electrically connected to a second end portion of the first conductive pattern; and an output circuit connected to the buffer circuit.

The semiconductor chip may further include: a second wiring structure over the first wiring structure, the second wiring structure being spaced apart from the first wiring structure, and the second wiring structure including a second conductive pattern formed along the edge portion of the semiconductor chip region; a second contact plug electrically connected to the second wiring structure and a second portion of the first wiring structure; and a third defect detection circuit electrically connected to the second wiring structure.

The first wiring structure may further include a third extension line; and the third extension line may be electrically connected to the third defect detection circuit via the second contact plug.

The semiconductor chip may further include: a plurality of memory cells in a memory cell region of the substrate; wherein the plurality of memory cells are between the substrate and the first wiring structure.

The plurality of memory cells may include memory cells of a NAND flash memory device. The NAND flash memory device may be a three-dimensional memory device including a three-dimensional VNAND memory array. The three-dimensional VNAND memory array may be monolithically formed in one or more physical levels of memory cells having active areas above the substrate. The memory cells of the three-dimensional VNAND memory array may include charge trap layers. At least one of word lines and bit lines in the three-dimensional VNAND memory array may be shared between levels of the three-dimensional VNAND memory array.

The gate pattern may serve as a conductive for detecting a crack in the substrate.

According to example embodiments, a semiconductor chip includes: a gate pattern on a substrate, the gate pattern being adjacent to an upper surface of the substrate, and the gate pattern being formed along an edge portion of a semiconductor chip region of the substrate; a first wiring structure over the gate pattern, the first wiring structure being spaced apart from the gate pattern, and the first wiring structure including a first conductive pattern overlapping the gate pattern; a first contact plug electrically connecting the gate pattern to a first portion of the first wiring structure; a first defect detection circuit electrically connected to the gate pattern; a second defect detection circuit electrically connected to the first wiring structure; a plurality of gate lines on the semiconductor chip region of the substrate, the plurality of gate lines being spaced apart from each other in a first direction substantially perpendicular to the upper surface of the substrate, and the plurality of gate lines extending in a second direction substantially parallel to the upper surface of the substrate; a vertical channel structure extending in the first direction through the plurality of gate lines; a second contact plug on an edge portion of each of the plurality of gate lines; a first wiring pattern contacting the second contact plug; and a bit line electrically connected to a pad pattern of the vertical channel structure.

The first wiring structure and the first wiring pattern may be formed on substantially the same plane.

The semiconductor chip may further include: a second wiring structure over the first wiring structure, the second wiring structure being spaced apart from the first wiring structure, and the second wiring structure including a second conductive pattern formed along the edge portion of the semiconductor chip region; a second contact plug electrically connecting the second wiring structure to a second portion of the first wiring structure; and a third defect detection circuit electrically connected to the second wiring structure.

The second wiring structure and the bit line may be formed on substantially the same plane.

The semiconductor chip may further include: a plurality of semiconductor chip regions; and a scribe lane between the plurality of semiconductor chip regions.

Each of the gate pattern and the first conductive pattern may have a rectangular ring shape; ends of the gate pattern may be spaced apart from one another, in a plan view; and ends of the first conductive pattern a be spaced apart from one another, in the plan view.

The first defect detection circuit may be electrically connected to opposite end portions of the gate pattern; and the second defect detection circuit may b electrically connected to opposite end portions of the first conductive pattern.

According to example embodiments, a semiconductor chip includes: a gate pattern on a substrate, the gate pattern being adjacent to an upper surface of the substrate, the gate pattern being formed along an edge portion of a semiconductor chip region of the substrate, and the gate pattern having a first end portion and a second end portion; a first wiring structure over the gate pattern, the first wiring structure being spaced apart from the gate pattern, and the first wiring structure including a plurality of first conductive patterns overlapping the gate pattern; a first contact plug electrically connecting the gate pattern to a portion of the first wiring structure; a first defect detection circuit electrically connected to the first and second end portions of the gate pattern; and a second defect detection circuit electrically connected to the plurality of first conductive patterns of the first wiring structure.

The first wiring structure may further include a first extension line and a second extension line; at least one of the plurality of first conductive pattern may have a rectangular ring shape; ends of the at least one first conductive pattern adjacent to the first and second defect detection circuits may be spaced apart from one another, in a plan view; the first extension line may contact a sidewall of the at least one first conductive pattern and extends toward the semiconductor chip region; and the second extension line may be spaced apart from the first extension line and contacts the first contact plug.

The first extension line may be connected to the second defect detection circuit; and the second extension line may be connected to the first defect detection circuit.

The first and second defect detection circuits may be in the semiconductor chip region.

The first defect detection circuit may include: a clock signal circuit electrically connected to the first end portion of the gate pattern, the clock signal circuit configured to operating according to a gate clock signal; a buffer circuit electrically connected to the second end portion of the gate pattern; and an output circuit connected to the buffer circuit.

The second defect detection circuit may include: a clock signal circuit electrically connected to a first end portion of at least one of the plurality of first conductive patterns, the clock signal circuit configured to operate according to a conductive pattern clock signal; a buffer circuit electrically connected to a second end portion of the at least one first conductive pattern; and an output circuit connected to the buffer circuit.

According to example embodiments, a method of detecting defects of a semiconductor chip includes: supplying a test clock signal to a test circuit of a semiconductor chip region of a substrate; supplying a gate clock signal to the test circuit, so that an electrical signal is supplied to a first end portion of a gate pattern, the gate pattern being adjacent to an upper surface of the substrate, and the gate pattern being formed along an edge portion of the semiconductor chip region; outputting a first output signal from a second end portion of the gate pattern; determining a first waveform and a first output delay time of the first output signal; and detecting defects of at least a portion of the substrate if the determined first waveform and first output delay time is outside of a first threshold range. The method may further include: supplying a first conductive pattern clock signal to the test circuit, so that an electrical signal is supplied to a first end portion of a conductive pattern on the gate pattern, the conductive pattern being formed along an edge portion of the semiconductor chip region; outputting a second output signal from a second end portion of the conductive pattern; determining a second waveform and a second output delay time of the second output signal; and detecting defects of at least a portion of the conductive pattern if the determined second waveform and second output delay time is outside of a second threshold range.

According example embodiments, a semiconductor chip includes: a gate pattern on a substrate; an interlayer insulation layer on the gate pattern; a first wiring structure on the interlayer insulation layer; and a defect detection circuit electrically connected to the gate pattern and the first wiring structure. The first wiring structure is electrically connected to the gate pattern via a contact plug through the interlayer insulation layer. The defect detection circuit is electrically connected to the gate pattern and the first wiring structure, and the defect detection circuit is configured to detect defects in the first wiring structure and at least one of the gate pattern and the substrate.

The defects may include at least one crack in at least one of the first wiring structure, the gate pattern and the substrate.

The defect detection circuit may further include a first crack detection circuit electrically connected to the gate pattern, the first crack detection circuit configured to detect the at least one crack in the at least one of the gate pattern and the substrate.

The defect detection circuit may further include a second crack detection circuit electrically connected to the first wiring structure, the second crack detection circuit configured to detect the at least one crack in the first wiring structure.

The defect detection circuit may be further configured to: supply a first input signal to a first end of the gate pattern in response to a first gate clock signal; receive a first output signal from a second end of the gate pattern; and detect a defect in at least one of the gate pattern and the substrate based on a relative timing of the first input signal and the first output signal.

The defect detection circuit may be further configured to: supply a second input signal to a first end of the first wiring structure in response to a second gate clock signal; receive a second output signal from a second end of the first wiring structure; and detect a defect in first wiring structure based on a relative timing of the second input signal and the second output signal.

In accordance with example embodiments, the semiconductor chip may be checked defects, such as crack, due to a sawing process of the substrate, before a mold process for packaging of the semiconductor chip. Also, cracks generated on the metal wiring and a surface of the substrate may be accurately detected. Further, cracks in any layers of the semiconductor chip may be detected. For example, the cracks generated from the metal wiring or the surface of the substrate may be separately detected. Thus, an electrical failure of the semiconductor chip may decrease. Also, the semiconductor chip may have a high reliability.

BRIEF DESCRIPTION OF THE DRAWINGS

Example embodiments will be more clearly understood from the following detailed description taken in conjunction with the accompanying drawings. FIGS. 1 to 6 represent non-limiting, example embodiments as described herein.

FIGS. 1A, 1B and 1C are plan views illustrating semiconductor chips in accordance with example embodiments;

FIGS. 2A and 2B are plan views illustrating portions of semiconductor chips in accordance with example embodiments;

FIG. 4 is a block diagram illustrating a crack detection part of a semiconductor chip in accordance with example embodiments;

FIG. 5 shows example signal timing for illustrating a method of detecting a crack of a semiconductor chip in accordance with example embodiments; and FIG. 6 is a cross-sectional view illustrating a vertical type NAND flash memory device including the crack detection part according to example embodiments.

DETAILED DESCRIPTION

Figure 3A:
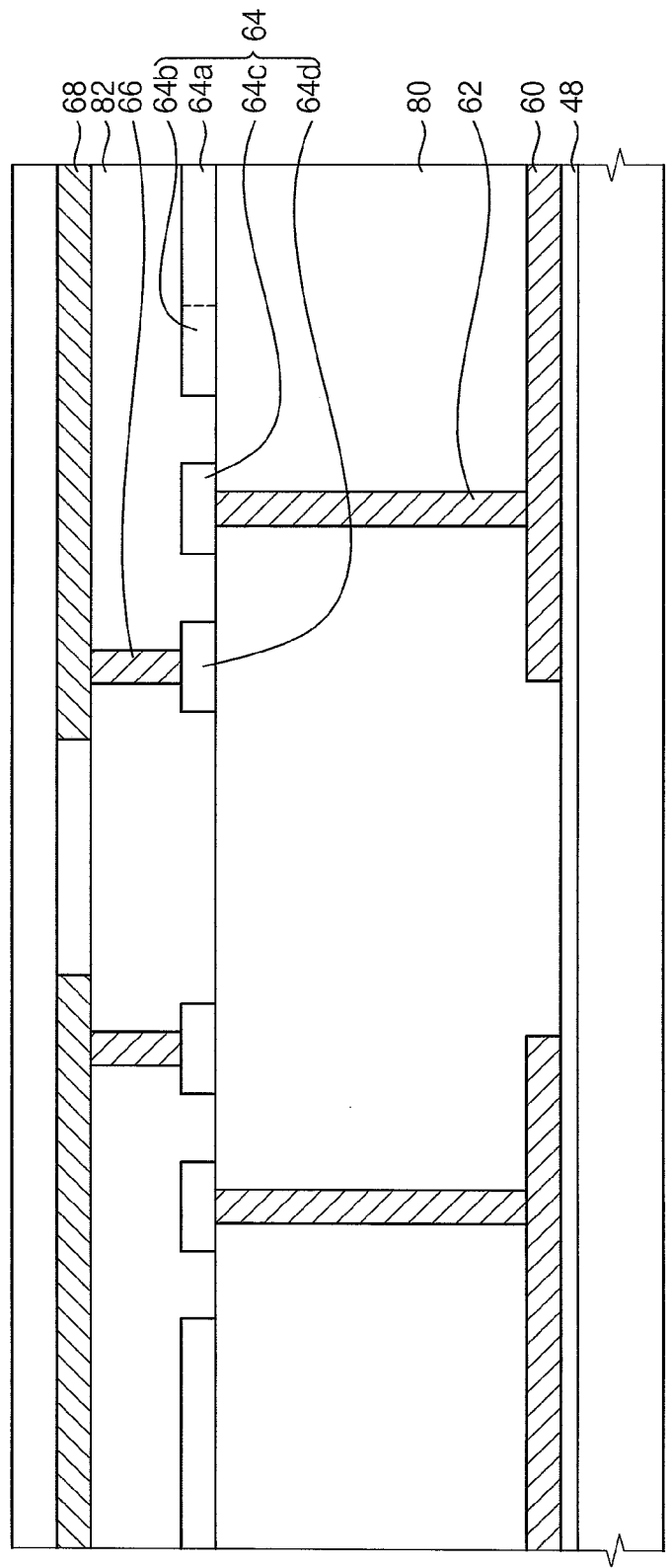
FIGS. 3A and 3B are cross-sectional views illustrating portions of semiconductor chips in accordance with example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3B:
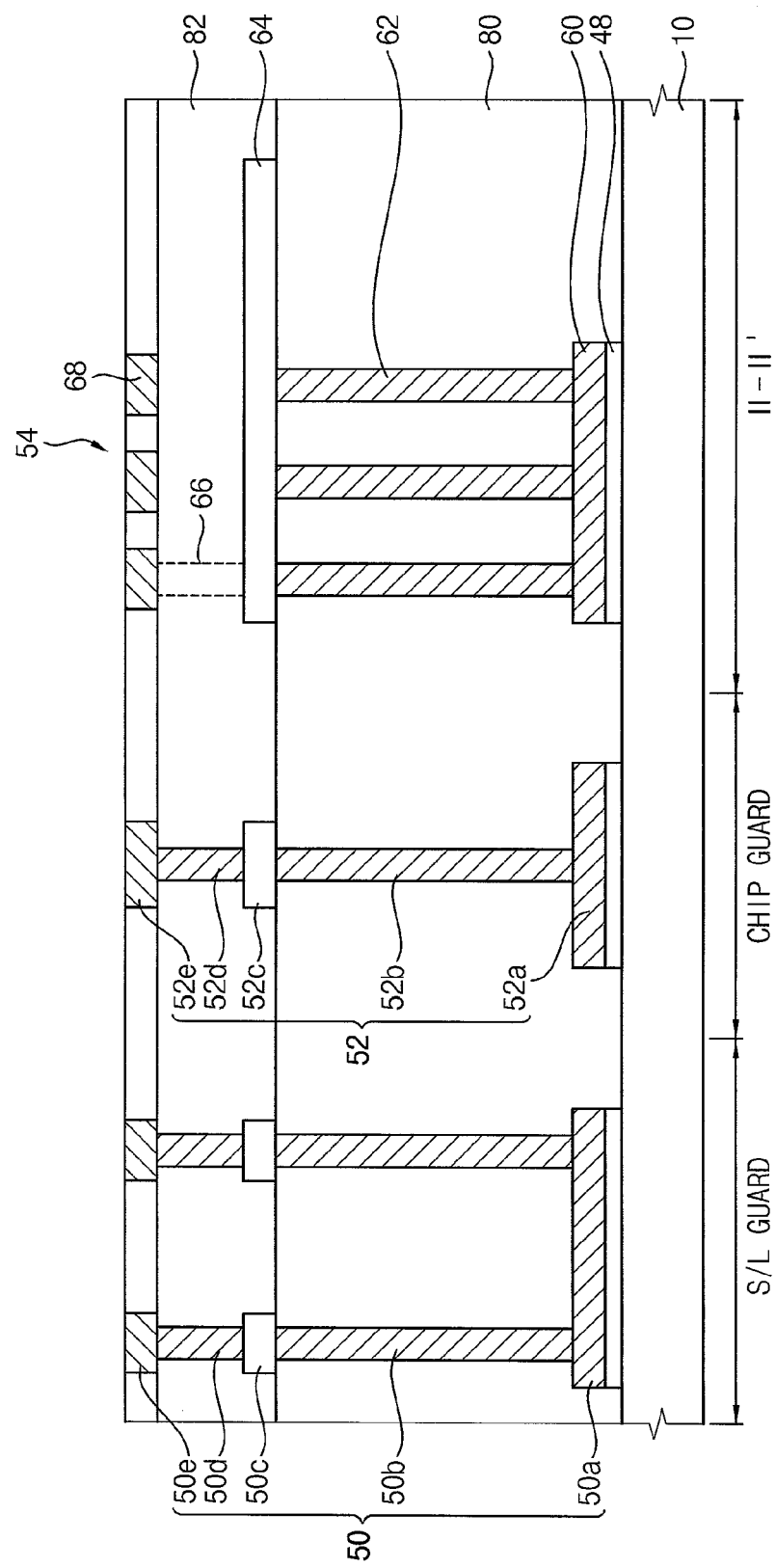
Figure 4:
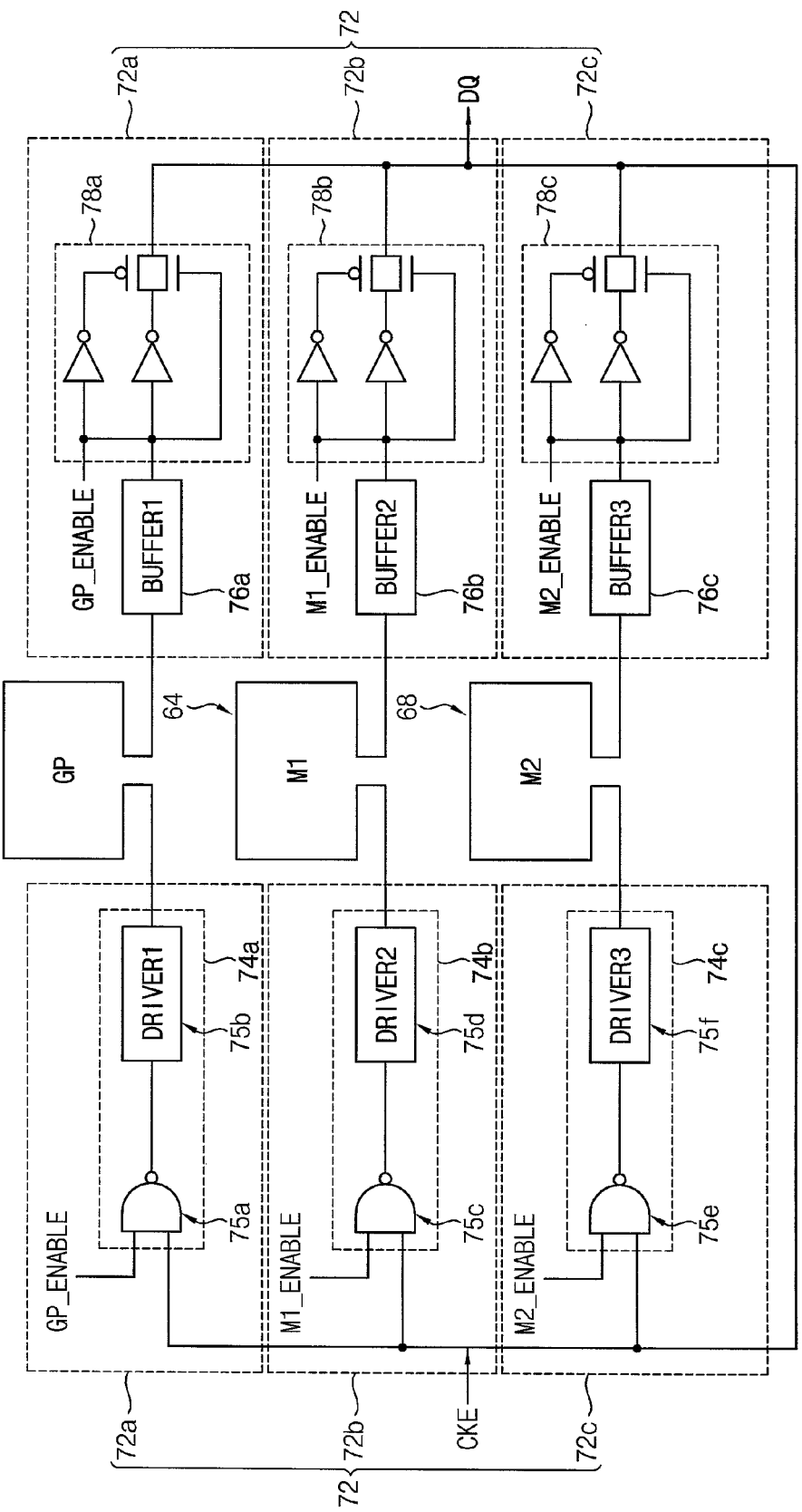

FIGS. 1A, 1B and 1C are plan views illustrating semiconductor chips in accordance with example embodiments. FIGS. 2A and 2B are plan views illustrating portions of semiconductor chips in accordance with example embodiments. FIGS. 3A and 3B are cross-sectional views illustrating portions of semiconductor chips in accordance with example embodiments. FIG. 4 is a block diagram illustrating a crack detection part and/or component of a semiconductor chip in accordance with example embodiments. The crack detection part may be also referred herein as a crack detection circuit.

FIGS. 1A, 1B and 1C illustrate example crack detection parts, respectively. Particularly, for example, FIG. 1A shows a second conductive pattern, FIG. 1B shows a first conductive pattern, and FIG. 1C shows a third gate pattern. FIG. 2A shows the first and second conductive patterns in a region "A" of FIGS. 1A and 1B. FIG. 2B shows the third gate pattern and a first conductive pattern in a region "A" of FIGS. 1B and 1C. FIG. 3A shows a cross-sectional view taken along a line I-I' of FIGS. 2A and 2B. FIG. 3B includes cross-sections of a portion taken along a line II-II' of FIGS. 2A and 2B, a scribe lane and the crack detection part.

Referring to FIGS. 1A, 1B, 1C, 2A, 2B, 3A, 3B and 4, a substrate 10 may include a semiconductor chip region 12 and a scribe lane 14. Memory cells may be formed in the semiconductor chip region 12, and a crack detection part 54 for detecting cracks may be formed along an edge portion of the semiconductor chip region 12.

A scribe lane guard ring structure 50 may be formed on the substrate 10, and may divide the substrate 10 into the semiconductor chip region 12 and the scribe lane 14.

In example embodiments, as shown in FIG. 3B, the scribe lane guard ring structure 50 may include a first gate pattern 50a, a first contact plug 50b, a first wiring 50c, a second contact plug 50d and a second wiring 50e.

The first gate pattern 50a, the first wiring 50c and the second wiring 50e may be spaced apart from each other in a first direction perpendicular or substantially perpendicular to an upper surface of the substrate 10. Each of the first gate pattern 50a, the first wiring 50c and the second wiring 50e may surround an interface between the semiconductor chip region 12 and the scribe lane 14. The first contact plug 50b may be electrically connected to the first gate pattern 50a and the first wiring 50c. The second contact plug 50d may be electrically connected to the first wiring 50c and the second wiring 50e.

The first gate pattern 50a may include, e.g., polysilicon. The first wiring 50c may include a first metal, and the second wiring 50e may include a second metal. Each of the first and second wirings 50c and 50e may include a metal and/or a metal nitride.

A chip guard ring structure 52 may be formed at an edge portion of the semiconductor chip region 12. Thus, the chip guard ring structure 52 may be formed in an inner portion of the semiconductor chip region 12 from the scribe lane guard ring structure 50.

In example embodiments, as shown in FIG. 3B, the chip guard ring structure 52 may include a second gate pattern 52a, a third contact plug 52b, a third wiring 52c, a fourth contact plug 52d and a fourth wiring 52e. For example, stacked layers of the chip guard ring structure 52 may be the same or substantially the same as stacked layers of the scribe lane guard ring structure 50.

The crack detection part 54 may be formed in the semiconductor chip region 12, and may be adjacent to the chip guard ring structure 52. Cracks in the semiconductor chip may be detected by the crack detection part 54. For example, when the substrate 10 is sawed along the scribe lane 14 to be divided into a plurality of semiconductor chips, the cracks in the semiconductor chips may be detected by the crack detection part 54.

In example embodiments, the crack detection part 54 may be formed on the substrate 10, and may include a third gate pattern 60, a first wiring structure 64, a second wiring structure 68, a fifth contact plug 62, a sixth contact plug 66 and a crack detection circuit part 72. Each of the third gate pattern 60 and the first and second wiring structures 64 and 68 may be electrically connected to each of crack detection circuits.

In example embodiments, as shown in FIG. 4, the crack detection circuit part 72 may include a first crack detection circuit part 72a, a second crack detection circuit part 72b and a third crack detection circuit part 72c. The third gate pattern 60, the first wiring structure 64 and the second wiring structure 68 may be electrically connected to the first crack detection circuit part 72a, the second crack detection circuit 72b and the third crack detection circuit part 72c, respectively. Thus, cracks generated from the third gate pattern 60, the first wiring structure 64 and the second wiring structure 68 may be separately detected.

The first, second and third gate patterns 50a, 52a and 60 may be concurrently and/or simultaneously formed on the substrate 10 during forming gate electrodes of the peripheral circuits and gate electrodes of the memory cells. A gate insulation layer 48 may be further formed between the substrate 10 and each of the first, second and third gate patterns 50a, 52a and 60. The first, second and third gate patterns 50a, 52a and 60 may be adjacent to the upper surface of the substrate 10.

In example embodiments, the first, second and third gate patterns 50a, 52a and 60 may include polysilicon. Alternatively, the first, second and third gate patterns 50a, 52a and 60 may include a metal nitride and/or a metal.

Hereinafter, an example embodiment of the crack detection part 54 will be described in more detail.

Referring to FIGS. 1C, 2B, 3A and 3B, the third gate pattern 60 may be adjacent to the upper surface of the substrate 10.

In FIGS. 1C and 2B, the third gate pattern 60 may be formed along an edge portion of the semiconductor chip region 12, except for a portion adjacent to the crack detection circuit part 72. That is, for example, the third gate pattern 60 may have a rectangular ring shape of which a portion adjacent to the crack detection circuit part 72 may be cut away, which may be referred to as a cutting area.

The third gate pattern 60 may have a first width W1. A first insulating interlayer 80 may be formed on the third gate pattern 60, referring to FIGS. 3A and 3B.

The third gate pattern 60 may have a first end portion and a second end portion. The first and second end portions are electrically connected to the first crack detection circuit part 72a, as shown in FIG. 4. Thus, defects, such as cracks, of the upper surface of the substrate 10 and/or the third gate pattern 60 may be detected by the first crack detection circuit part 72a.

Referring to FIGS. 1B, 2A, 2B, 3A and 3B, the first wiring structure 64 may be formed on the first insulating interlayer 80.

Referring to FIG. 1B, the first wiring structure 64 may include a plurality of first conductive pattern 64a, a first extension pattern 64b, a second extension pattern 64c and a third extension pattern 64d. The first extension pattern 64b may contact end portions of the first conductive patterns 64a. Each of the third and fourth extension patterns 64c and 64d may be spaced apart from the first extension pattern 64b in a second direction.

In FIGS. 1B, 2A and 2B, each of the first conductive patterns 64a may be formed along an edge portion of the semiconductor chip region 12, except for a portion adjacent to the crack detection circuit part 72. That is, for example, each of the first conductive patterns 64a may have a rectangular ring shape of which a portion adjacent to the crack detection circuit part 72 may be cut away, which may be referred to as a cutting area. In example embodiments, the first conductive patterns 64a may be spaced apart from each other, and may be arranged in concentric circles.

Referring to FIG. 2B, each of the first conductive patterns 64a may have a second width W2, which is less than the first width WI, In example embodiments, each of the first conductive patterns 64a may overlap the third gate pattern 60. Thus, a sum of the second widths W2 of the first conductive patterns 64a and distances between neighboring ones of the first conductive patterns 64a may be the same as, substantially the same as or less than the first width W1.

Alternatively, only one first conductive pattern 64a may be provided, and the first conductive pattern 64a may overlap the third gate pattern 60. In this case, the second width W2 of the first conductive pattern 64a may be the same or substantially the same as the first width W1.

In example embodiments, the first wiring structure 64 may include a plurality of first extension patterns 64b, a plurality of second extension patterns 64c, and a plurality of third extension patterns 64d. Each of the first, second and third extension patterns 64b, 64c and 64d may extend toward the semiconductor chip region 12 in a third direction that is perpendicular or substantially perpendicular to an extension direction of the first conductive pattern 64a. The first, second and third extension patterns 64b, 64c and 64d may be arranged in the second direction.

The first extension pattern 64b may contact end portions of the first conductive patterns 64a. That is, for example, the first extension pattern 64b may be electrically connected to the first conductive pattern 64a and the second crack detection circuit part 72b. Thus, the defects of the first wiring structure 64, such as cracks, may be detected by second crack detection circuit part 72b.

The second extension pattern 64c may be spaced apart from the first extension pattern 64b in the second direction, and may be disposed in the cutting area of the first conductive patterns 64a.

Referring to FIG. 2B, the second extension pattern 64c may cross the third gate pattern 60. The second extension pattern 64c may be electrically connected to the first crack detection circuit part 72a.

The third extension pattern 64d may be spaced apart from the second extension pattern 64c in the second direction, and may be disposed in the cutting area of the first conductive patterns 64a.

Referring to FIG. 2A, the third extension pattern 64d may cross a second conductive pattern 68a included in the second wiring structure 68. The third extension pattern 64d may be electrically connected to the third crack detection circuit part 72c.

The first, second and third extension patterns 64b, 64c and 64d and the first conductive patterns may be formed by the same or substantially the same deposition and etching processes.

Memory cells (not shown) may be formed on the semiconductor chip region 12 of the substrate 10, and the memory cells may be disposed between the substrate 10 and the first wiring structure 64 in the first direction. That is, for example, the first insulating interlayer 80 may sufficiently cover the memory cells. The first wiring structure 64 may be formed at a level higher than upper portions of the memory cells. In example embodiments, the memory cells may include memory cells of a vertical NAND flash memory device.

A first metal wiring (not shown) may be formed on the semiconductor chip region 12 of the substrate 10, and may be electrically connected to the memory cells. The first wiring structure 64 and the first metal wiring may be formed by the same or substantially the same processes. The first wiring structure 64 may include a barrier layer and a metal layer.

Referring to FIG. 3A, the fifth contact plug 62 may be formed through the first insulating interlayer 80, and may be electrically connected to the third gate pattern 60 and the second extension pattern 64c. Thus, an upper surface and a lower surface of the fifth contact plug 62 may contact a lower surface of the second extension pattern 64c and an upper surface of the third gate pattern 60, respectively.

Referring to FIG. 4, the second extension pattern 64c and the first crack detection circuit part 72a may be electrically connected to each other, so that the cracks of the third gate pattern 60 and the upper surface of the substrate 10 may be detected by the first crack detection circuit part 72a.

A first intermetal dielectric (IMD) layer 82 may be formed on the first wiring structure 64.

Referring to FIGS. 1A, 2A, 3A and 3B, the second wiring structure 68 may be formed on the first IMD layer 82. The second wiring structure 68 may include a plurality of second conductive patterns 68a.

In FIGS. 1A and 2A, each of the second conductive patterns 68a may be formed along an edge portion of the semiconductor chip region 12, except for a portion adjacent to the crack detection circuit part 72. Each of the second conductive patterns 68a may haven rectangular ring shape of which a portion adjacent to the crack detection circuit part 72 may be cut away, which may be referred to as a cutting area. The second conductive patterns 68a may be spaced apart from each other, and may be arranged in concentric circles.

In example embodiments, the second conductive patterns 68*a* may overlap the first conductive patterns 64*a*. Also, each of the second conductive patterns 68*a* may extend to portions of the first, second and the third extension patterns 68*b*, 68*c* and 68*d*.

Each of the second conductive patterns 68*a* may have a third width W3 less than the first width W1. Thus, a sum of the third widths W3 of the second conductive patterns 68*a* and distances between neighboring ones of the second conductive patterns 68*a* may be the same as, substantially the same as or less than the first width W1. In example embodiments, the third width W3 may be the same or substantially the same as the second width W2.

Alternatively, only one second conductive pattern 68*a* may be provided to have the rectangular ring shape having the cutting area. In this case, the third width W3 of the second conductive pattern 68*a* may be the same or substantially the same as the first width W1.

In example embodiments, a plurality of second metal wirings (not shown) may be formed on the semiconductor chip region 12 of the substrate 10 to be electrically connected to the memory cells and/or the first metal wiring. The second metal wiring and the second wiring structure 68 may be formed by the same or substantially the same processes. The second wiring structure 68 may include a barrier layer and a metal layer.

Referring to FIGS. 3A and 3B, the sixth contact plug 66 may be formed through the first IMD layer 82 to be electrically connected to the third extension pattern 64*d* and the second conductive pattern 68*a*. Thus, an upper surface and a lower surface of the sixth contact plug 66 may contact a lower surface of the second conductive pattern 68*a* and an upper surface of the third extension pattern 64*d*, respectively.

Referring to FIG. 4, the third extension pattern 64*d* and the third crack detection circuit part 72*c* may be electrically connected to each other, so that the cracks of the second wiring structure 68 may be detected by the third crack detection circuit part 72*c*.

As described above, the first, second and third crack detection circuit parts 72*a*, 72*b* and 72*c* may detect cracks of the third gate pattern 60, the first conductive pattern 64*a* and the second conductive pattern 68*a*, respectively. The composition of circuits included in each of the first, second and third crack detection circuit parts 72*a* 72*b* and 72*c* may be the same as, substantially the same as, or similar to each other.

Hereinafter, the first, second and third crack detection circuit parts 72*a*, 72*b* and 72*c* will be described in more detail with reference to FIG 4.

Referring to FIG. 4, the first crack detection circuit part 72*a* may include a first clock signal part 74*a*, a first butler part 76*a*, and a first output part 78*a*. The first clock signal part 74*a* may be electrically connected to a first end portion of the third gate pattern 60, and the first buffer part 76*a* and the first output part 78*a* may be electrically connected to a second end portion of the third gate pattern 60. The first crack detection circuit part 72*a* may be electrically connected to the third gate pattern via the second extension pattern 64*c*.

The first clock signal part 74*a* may include a first input part 75*a* and a first driver 75*b*. The first input part 75*a* may receive a gate enable signal G-P ENABLE and a test enable clock signal CKE.

In example embodiments, the first input part 75*a* may include a NAND circuit. The first driver 75*b* may include a plurality of inverters connected to each other.

In example embodiments, the first buffer part 76*a* may include a tri-state buffer transistor. An inverted gate enable signal may be supplied to a gate of an upper PMOS transistor in the tri-state buffer transistor. Also, the gate enable signal may be supplied to a gate of a lower NMOS transistor in the tri-state buffer transistor.

In example embodiments, the first output part 78*a* may include a transmission gate. The inverted gate enable signal may be supplied to each of gates included in the transmission gate.

The second crack detection circuit part 72*b* may include a second clock signal part 74*b*, a second buffer part 76*b* and a second output part 78*b*. The second clock signal part 74*b* may be electrically connected to first end portions of the first conductive patterns 64*a*, and the second buffer part 76*b* and the second output part 75*c* may be electrically connected to second end portions of the first conductive patterns 64*a*.

The second clock signal part 74*b* may include a second input part 75*c* and a second driver 75*d*. The second input part 75*c* may receive an enable signal of the first conductive pattern M1-ENABLE and the test enable clock signal CKE.

In example embodiments, the second input part 75*c* may include a NAND circle The second driver 75*d* may include a plurality of inverters connected to each other.

In example embodiments, the second buffer part 76*b* may include a tri-state buffer transistor. An inverted enable signal of the first conductive pattern may be supplied to a gate of an upper PMOS transistor in the tri-state buffer transistor. Also, the enable signal of the first conductive pattern may be supplied to a gate of a lower NMOS transistor in the tri-state buffer transistor.

In example embodiments, the second output part 78*b* may include a transmission gate. The inverted enable signal of the first conductive pattern may be supplied to each of gates included in the transmission gate.

The third crack detection circuit part 72*c* may include a third clock signal part 74*c*, a third buffer part 76*c*, and a third output part 78*c*. The third clock signal part 74*c* may be electrically connected to first end portions of the second conductive patterns 68*a*, and the third buffer part 76*c* and the third output part 78*c* may be electrically connected to second end portions of the second conductive patterns 68*a*.

The third clock signal part 74*c* may include a third input part 75*e* and a third driver 75*f* The third input part 75*e* may receive an enable signal of the second conductive pattern M2-ENABLE and the test enable clock signal CKE.

In example embodiments, the third input part 75*e* may include a NAND circuit. The third driver 75*f* may include a plurality of inverters connected to each other.

In example embodiments, the third buffer part 76*c* may include a tri-state buffer transistor. An inverted enable signal of the second conductive pattern may be supplied to a gate of an upper PMOS transistor in the tri-state buffer transistor. Also, the enable signal of the second conductive pattern may be supplied to a gate of a lower NMOS transistor in the tri-state buffer transistor.

In example embodiments, the third output part 78*c* may include a transmission gate. The inverted enable signal of the second conductive pattern may be supplied to each of gates included in the transmission gate.

Figure 5:
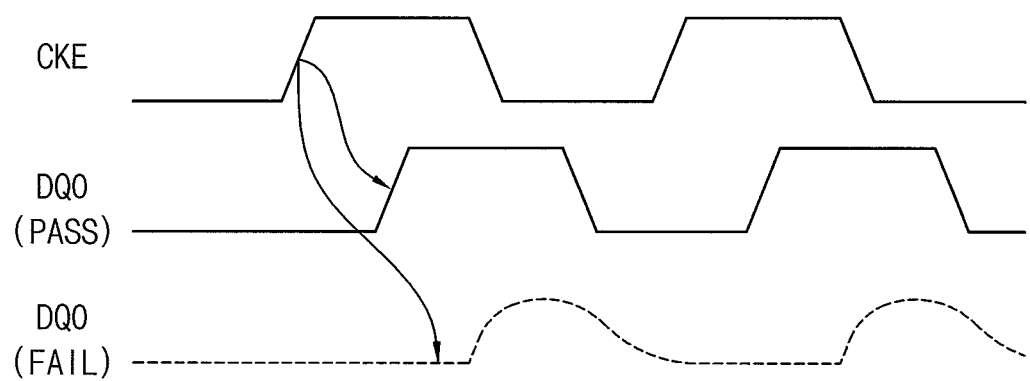

FIG. 5 shows example signal timings for illustrating a method of detecting crack of a semiconductor chip in accordance with example embodiments.

Referring to FIGS. 4 and 5, in order to detect the cracks of the semiconductor chip, a crack test mode may be set by operating a mode registration set (MRS). The MRS may generate a test command by combining address signals transmitted through an address bus, and a registration may be set to a crack testing mode.

Thus, the test enable clock signal CKE may be supplied into each of the first, second and third input parts 75a, 75c and 75e. The test enable clock signal CKE may be periodically and repeatedly supplied in a pulsed manner. The test enable clock signal CKE may be a voltage pulse signal or a current pulse signal.

In order to check the cracks of the third gate pattern 60 or an active region of the substrate 10, the gate enable signal GP-ENABLE may be supplied into the first input part 75a. When the test enable clock signal CKE and the gate enable signal GP-ENABLE are input to the first input part 75a, a signal may be transferred to the third gate pattern 60, a first buffer part 76a and a first output part 78a via a first driver 75b. A level of the signal may be continuously changed through the third gate pattern 60, a first buffer part 76a and a first output part 78a, and thus a first output signal may be output after a given delay time.

In example embodiments, when the test enable clock signal CKE and the gate enable signal GP-ENABLE are input together to the first input part 75a, the signal may be transferred. Thus, the first output signal may have a waveform that is the same or substantially the same as a waveform of the test enable clock signal CKE, which may be a current pulse or a voltage pulse. However, the first output signal may be output through the first output part 78a, after the given delay time from the input time of the test enable clock signal CKE.

Referring to FIG. 5, when the cracks of the third gate pattern 60 are not generated, the first output signal DQ0 (PASS) may be output after the given delay time to have a waveform that is the same or substantially the same as a waveform of the test enable clock signal CKE.

If the cracks of the third gate pattern 60 are generated, the third gate pattern 60 may be open, or may have a relatively high resistance. Thus, the first output signal DQ0 (FAIL) may be abnormal, or the delay time at which the first output signal may be output may be further delayed than a normal time range. When the first output signal DQ0 (FAIL) does not have a waveform that is the same or substantially the same as a waveform of the test clock signal CKE, or when the delay time is outside of the normal time range, the crack may be determined to be generated in the third gate pattern 60 and the portion of the substrate 10.

In order to check the cracks of a portion of the first wiring structure 64, the first conductive pattern enable signal M1-ENABLE may be supplied into the second input part 75c. The test enable clock signal CKE may be a current pulse or a voltage pulse.

When the test enable clock signal CKE and the first conductive pattern enable signal M1-ENABLE are input to the second input part, a signal may be transferred to the first conductive pattern 64a, a second buffer part 76b and a second output part 78b via a second driver 75d.

In example embodiments, when the test clock signal CKE and the first conductive pattern enable signal M1-ENABLE are input together to the second input part 75c, the signal may be only transferred, so that the second output signal may be output through the second output part 78b. The second output signal may have a waveform that is the same or substantially the same as a waveform of the test enable clock signal CKE, which may be a current pulse or a voltage pulse. However, the second output signal may be output after the given delay time from the input time of the test enable clock signal CKE.

Thus, when the second output signal does not have a waveform that is the same or substantial) the same as a waveform of the test clock signal CKE, or when the delay time is outside of a normal time range, the crack may be determined to be generated in the portion of the first wiring structure 64.

In order to check the cracks of a portion of the second wiring structure 68, the second conductive pattern enable signal M2-ENABLE may be supplied into the third input part 75e. When the test enable clock signal CKE and the second conducive pattern enable signal M2-ENABLE are input to the third input part 75e, a signal may be transferred to the second conductive pattern 68a, a third buffer part 76c and a third output part 78c via a third driver 75f.

A third output signal may be output through the third output part 78c. In example embodiments, when the third output signal does not have a waveform that is the same or substantially the same as a waveform of the test clock signal, or when the delay time is out of a normal time range, the crack may be determined to be generated in the portion of the second wiring structure 68.

For example, when the substrate 10 is sawed along the scribe lane to be separated into a plurality of semiconductor chips, cracks of the semiconductor chips may be generated. Before performing a molding process for packaging the semiconductor chips, the cracks of the semiconductor chips may be checked.

The cracks in wirings over upper memory cells, the third gate pattern 60 and the upper surface of the substrate 10 may be detected. Also, the cracks may be checked in each level. Thus, the cracks generated in the semiconductor chip may be more accurately determined, and a failure of the semiconductor chip due to the cracks may be reduced.

The crack detection part may be used in various semiconductor devices including a memory device, e.g., NAND flash memory device, a dynamic random access memory (DRAM), a static random access memory (SRAM), two or three-dimensional memory devices, etc., or a logic device.

Hereinafter, a vertical type NAND flash memory device including the crack detection part will be described. However, example embodiments should not be limited to this example.

Figure 6:
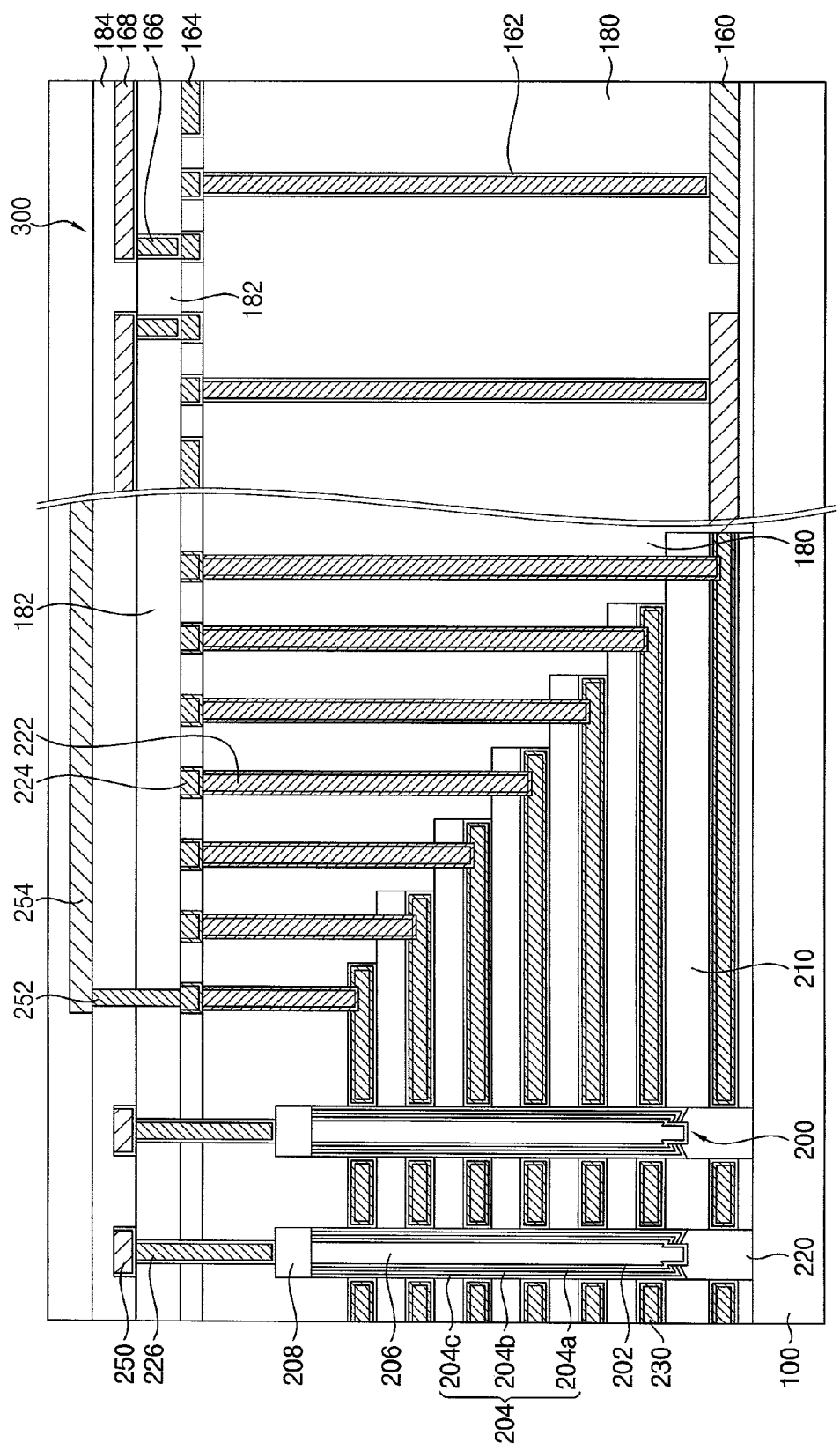

FIG. 6 is a cross-sectional view illustrating a vertical type NAND flash memory device including the crack detection part according to example embodiments.

Referring to FIG. 6, a semiconductor substrate 100 may include a semiconductor chip region and a scribe lane.

A scribe lane guard ring structure (not shown) may be formed on the substrate 100, and may divide the substrate 100 into the semiconductor chip region and the scribe lane. chip guarder ring structure (not shown) may be formed at an edge portion of the semiconductor chip region. The scribe lane guard ring structure and the semiconductor chip region may be the same as, substantially the same as, or similar to the scribe lane guard ring structure and the semiconductor chip region, respectively, illustrated with reference to FIGS. 1A, 1B and 1C.

The crack detection part 300 may be formed at an inner portion of the semiconductor chip region, and may be formed to be adjacent to the chip guard ring structure. NAND flash memory cells and peripheral circuits for operating the NAND flash memory cells may be formed in the semiconductor chip region.

In example embodiments, the crack detection part 300 may be formed on the substrate 100, and may include a third gate pattern 160, a first wiring structure 164, a second wiring structure 168, a fifth contact plug 162, a sixth contact plug 166 and a crack detection circuit part.

The crack detection part may be the same, substantially the same as, or similar to example embodiments of the crack detection part illustrated with reference to FIGS. 1A, 1B, 1C, 2A, 2B, 3A, 3B and 4.

The NAND flash memory cells may include a vertical channel structure 200, which may be formed on the substrate 100 and extend in the first direction perpendicular or substantially perpendicular to an upper surface of the substrate 100. A plurality of gate lines 230 may be formed, and each of the gate lines 230 may surround the vertical channel structure 200.

The vertical channel structure 200 may include a channel pattern 202, a structure 204 and a filling insulation pattern 206. The structure 204 may include a tunnel insulation layer 204a, a charge storage layer 204b and a blocking dielectric layer 204c. The vertical channel structure 200 may penetrate through the gate lines 230, and may extend in the first direction.

The channel pattern 202 may have a have a hollow cylindrical shape or a cup shape. The channel pattern 202 may include polysilicon or single crystalline silicon.

A filling insulation pattern 206 may be formed on the channel pattern 202, and may fill an inner space formed by the channel structure having the hollow cylindrical shape or the cup shape. The filling insulation pattern 206 may have a pillar shape. The filling insulation pattern 206 may include, e.g., silicon oxide.

In some example embodiments, the channel pattern 202 may have a pillar shape. In this case, the filling insulation pattern 206 may not be formed on the channel pattern 202.

The tunnel insulation layer 204a, the charge storage layer 204b and the blocking dielectric layer 204c may be sequentially formed on an outer sidewall of the channel pattern 202. The structure 204 including the tunnel insulation layer 204a, the charge storage layer 204b and the blocking dielectric layer 204c may surround the outer sidewall of the channel pattern 202. In example embodiments, the tunnel insulation layer 204a may include an oxide, e.g., silicon oxide. The charge storage layer 204b may include a nitride, e.g., silicon nitride. The first blocking dielectric layer 204c may include an oxide, e.g., silicon oxide.

In example embodiments, a semiconductor pattern 220 may be further formed between the substrate 100 and the vertical channel structure 200. T be semiconductor pattern 220 may contact an upper surface of the substrate 100. The semiconductor pattern 220 may have a pillar shape, and the vertical channel structure 200 may be formed on the semiconductor pattern 220.

A pad pattern 208 may be formed on the channel pattern 202, the tunnel insulation layer 204a, the charge storage layer 204b, the blocking dielectric layer 204c and the filling insulation pattern 206. The pad pattern 208 may be electrically connected to, e.g., a bit line 250 of the vertical memory device.

The gate lines 230 may be spaced apart from each other in the first direction, and an insulation layer 210 may be formed between the gate lines 230. In example embodiments, the gate lines 230 may extend in the second direction substantially parallel to a top surface of the substrate 100.

The gat lines 230 may include a ground selection line (GSL), word lines and a string selection line (SSL). In example embodiments, a lowermost gate line 230 may serve as the GSL, and an uppermost gate line 230 may serve as the SSL. The word lines may be formed between the GSL and the SSL.

The word lines may be stacked at a plurality of layers, respectively. In example embodiments, the word lines may be a 64-story layer or a 128-story layer. Thus, a gate stack structure including the gate lines 230 and the insulation layer 210 repeatedly and alternatively stacked may have a relatively substantial (e.g., great) thickness.

In example embodiments, edge portions of the gate lines 230 may have stepped shapes, and upper surfaces of the edge portions of the gate lines 230 may be exposed.

A first insulating interlayer 180 may cover the vertical channel structure 200 and the gate stack structure. The first insulating interlayer 180 may be same or substantially the same as the first insulating interlayer 180 included in the crack detection part.

A seventh contact plug 222 may be formed through the first insulating interlayer 180, and may contact the upper surface of the edge portion of each of the gate lines 230. A fifth wiring 224 may be formed on the seventh contact plug 222 and the first insulating interlayer 180.

The seventh contact plug 222 and the fifth contact plug 223 in the crack detection part may be formed by the same or substantially the same processes. The fifth wiring 224 and the first wiring structure 164 may be formed by the same or substantially the same processes.

The first wiring structure 164 and the fifth wiring 224 may include a metal. Each of the first wiring structure 164 and the fifth wiring 224 may include a barrier layer and a metal layer.

In the vertical NAND flash memory device according to example embodiments, the memory cells may be stacked in the first direction, so that the first insulating interlayer 180 may have a relatively substantial (e.g., great) thickness. Thus, the fifth contact plug 162 and the seventh contact plug 222 may have a relatively substantial (e.g., great) heights.

A first IMD layer 182 may cover the fifth wiring 224. An eighth contact plug 226 may be formed through the first IMD layer 182 and the first insulating interlayer 180, and may contact an upper surface of the pad pattern 208. The bit line 250 may be formed on the eighth contact plug 226.

The first IMD layer 182 may be same or substantially the same as the first IMD layer 182 included in the crack detection part. The eighth contact plug 226 and the sixth contact 166 may be formed by the same or substantially the same processes. The bit line 250 and the second wiring structure 168 may be formed by the same or substantially the same processes.

The second wiring structure 168 and the bit line 250 may include a metal. Each of the second wiring structure 168 and the bit line 250 may include a barrier layer and a metal layer.

A second IMD layer 184 may be formed on the first IMD layer 182, and may cover the bit line 250 and the second wiring structure 168. A ninth contact plug 252 may be formed through the second and first IMD interlayers 184 and 182, and may contact the fifth wiring 224. A sixth wiring 254 may be further formed on the ninth contact plug 252.

As described above, in a vertical NAND flash memory device, the memory cells may be stacked in the first direction, so that an uppermost memory cell may be formed at a relatively high level. Thus, a gap between conductive patterns formed over the memory cells and the substrate 100 may increase, so that a crack of the substrate 100 may not affect the conductive pattern.

However, in example embodiments, cracks of the substrate 100 and the gate pattern may be more accurately detected by the first crack detection circuit part of the crack detection part. Cracks in any layers of the semiconductor chip may be detected. Thus, the cracks in the semiconductor chip may be more accurately detected, so that failures due to the cracks may decrease.

Example embodiments of the crack detection part may be applied to various types of memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip, comprising:
a gate pattern on a substrate, the gate pattern being adjacent to an upper surface of the substrate, and the gate pattern being formed along an edge portion of a semiconductor chip region of the substrate;
a first wiring structure over the gate pattern, the first wiring structure being spaced apart from the gate pattern, and the first wiring structure including a first conductive pattern formed along the edge portion of the semiconductor chip region;
a first contact plug electrically connecting the gate pattern to a first portion of the first wiring structure;
a first defect detection circuit electrically connected to the gate pattern; and
a second defect detection circuit electrically connected to the first wiring structure.

2. The semiconductor chip of claim 1, wherein
the gate pattern has a rectangular ring shape; and
ends of the gate pattern are adjacent to the first and second defect detection circuits and are spaced apart from one another, in a plan view.

3. The semiconductor chip of claim 1, wherein
the first wiring structure further includes a first extension line and a second extension line;
the first conductive pattern has a rectangular ring shape;
ends of the first conductive pattern are adjacent to the first and second defect detection circuits, and are spaced apart from one another, in a plan view;
the first extension line contacts a sidewall of the first conductive pattern and extends toward the semiconductor chip region; and
the second extension line is spaced apart from the first extension line and contacts the first contact plug.

4. The semiconductor chip of claim 1, wherein the first defect detection circuit comprises:
a clock signal circuit electrically connected to a first end portion of the gate pattern, the clock signal circuit configured to operate according to a gate clock signal;
a buffer circuit electrically connected to a second end portion of the gate pattern; and
an output circuit connected to the buffer circuit.

5. The semiconductor chip of claim 1, wherein the second defect detection circuit comprises:
a clock signal circuit electrically connected to a first end portion of the first conductive pattern, the clock signal circuit configured to operate according to a first conductive pattern clock signal;
a buffer circuit electrically connected to a second end portion of the first conductive pattern; and
an output circuit connected to the buffer circuit.

6. The semiconductor chip of claim 1, further comprising:
a second wiring structure over the first wiring structure, the second wiring structure being spaced apart from the first wiring structure, and the second wiring structure including a second conductive pattern formed along the edge portion of the semiconductor chip region;
a second contact plug electrically connected to the second wiring structure and a second portion of the first wiring structure; and
a third defect detection circuit electrically connected to the second wiring structure.

7. The semiconductor chip of claim 1, further comprising:
a plurality of memory cells in a memory cell region of the substrate; wherein
the plurality of memory cells are between the substrate and the first wiring structure.

8. The semiconductor chip of claim 7, wherein the plurality of memory cells include memory cells of a NAND flash memory device.

9. The semiconductor chip of claim 8, wherein the NAND flash memory device is a three-dimensional memory device including a three-dimensional VNAND memory array.

10. A semiconductor chip, comprising:
a gate pattern on a substrate, the gate pattern being adjacent to an upper surface of the substrate, the gate pattern being formed along an edge portion of a semiconductor chip region of the substrate, and the gate pattern having a first end portion and a second end portion;
a first wiring structure over the gate pattern, the first wiring structure being spaced apart from the gate pattern, and the first wiring structure including a plurality of first conductive patterns overlapping the gate pattern;
a first contact plug electrically connecting the gate pattern to a portion of the first wiring structure;
a first defect detection circuit electrically connected to the first and second end portions of the gate pattern; and
a second defect detection circuit electrically connected to the plurality of first conductive patterns of the first wiring structure.

11. The semiconductor chip of claim 10, wherein
the first wiring structure further includes a first extension line and a second extension line;
at least one of the plurality of first conductive patterns has a rectangular ring shape;
ends of the at least one first conductive pattern adjacent to the first and second defect detection circuits are spaced apart from one another, in a plan view;
the first extension line contacts a sidewall of the at least one first conductive pattern and extends toward the semiconductor chip region; and
the second extension line is spaced apart from the first extension line and contacts the first contact plug.

12. The semiconductor chip of claim 10, wherein
the first extension line is connected to the second defect detection circuit; and the second extension line is connected to the first defect detection circuit.

13. The semiconductor chip of claim 10, wherein the first and second defect detection circuits are in the semiconductor chip region.

14. The semiconductor chip of claim 10, wherein the first defect detection circuit comprises:
a clock signal circuit electrically connected to the first end portion of the gate pattern, the clock signal circuit configured to operating according to a gate clock signal;
a buffer circuit electrically connected to the second end portion of the gate pattern; and
an output circuit connected to the buffer circuit.

15. The semiconductor chip of claim 10, wherein the second defect detection circuit comprises:
a clock signal circuit electrically connected to a first end portion of at least one of the plurality of first conductive patterns, the clock signal circuit configured to operate according to a conductive pattern clock signal;
a buffer circuit electrically connected to a second end portion of the at least one first conductive pattern; and
an output circuit connected to the buffer circuit.

16. A semiconductor chip comprising:
a gate pattern on a substrate;
an interlayer insulation layer on the gate pattern;
a first wiring structure on the interlayer insulation layer, the first wiring structure electrically connected to the gate pattern via a contact plug through the interlayer insulation layer; and
a defect detection circuit electrically connected to the gate pattern and the first wiring structure, the defect detection circuit configured to separately detect (i) at least one first defect in the first wiring structure and (ii) at least one second defect in at least one of the gate pattern and the substrate.

17. The semiconductor chip of claim 16, wherein
the at least one second defect includes at least one crack in the at least one of the gate pattern and the substrate; and
the defect detection circuit includes a first crack detection circuit electrically connected to the gate pattern, the first crack detection circuit configured to detect the at least one crack in the at least one of the gate pattern and the substrate.

18. The semiconductor chip of claim 17, wherein
the at least one first defect includes at least one crack in the first wiring structure; and
the defect detection circuit further includes a second crack detection circuit electrically connected to the first wiring structure, the second crack detection circuit configured to detect the at least one crack in the first wiring structure.

19. The semiconductor chip of claim 16, wherein the defect detection circuit is further configured to
supply a first input signal to a first end of the gate pattern in response to a first gate clock signal;
receive a first output signal from a second end of the gate pattern; and
detect the at least one second defect in the at least one of the gate pattern and the substrate based on a relative timing of the first input signal and the first output signal.

20. The semiconductor chip of claim 19, wherein the defect detection circuit is further configured to
supply a second input signal to a first end of the first wiring structure in response to a second gate clock signal;
receive a second output signal from a second end of the first wiring structure; and
detect the at least one first defect in the first wiring structure based on a relative timing of the second input signal and the second output signal.

* * * * *